United States Patent
Chien et al.

(10) Patent No.: US 10,942,653 B2
(45) Date of Patent: Mar. 9, 2021

(54) METHOD FOR PERFORMING REFRESH MANAGEMENT IN A MEMORY DEVICE, ASSOCIATED MEMORY DEVICE AND CONTROLLER THEREOF

(71) Applicant: Silicon Motion Inc., Hsinchu County (TW)

(72) Inventors: Jieh-Hsin Chien, Taoyuan (TW); Yi-Hua Pao, Hsinchu (TW)

(73) Assignee: Silicon Motion, Inc., Hsinchu County (TW)

(*) Notice: Subject to any disclaimer, the term of this patent is extended or adjusted under 35 U.S.C. 154(b) by 0 days.

(21) Appl. No.: 16/039,342

(22) Filed: Jul. 19, 2018

(65) Prior Publication Data

US 2019/0146687 A1    May 16, 2019

(30) Foreign Application Priority Data

Nov. 16, 2017 (TW) .................. 106139599

(51) Int. Cl.
*G06F 3/06* (2006.01)
*G11C 7/04* (2006.01)
*G11C 16/34* (2006.01)

(52) U.S. Cl.
CPC .......... *G06F 3/0619* (2013.01); *G06F 3/0653* (2013.01); *G06F 3/0658* (2013.01); *G06F 3/0659* (2013.01); *G06F 3/0679* (2013.01); *G11C 7/04* (2013.01); *G11C 16/3418* (2013.01)

(58) Field of Classification Search
CPC .. G06F 12/0246; G06F 3/0653; G06F 3/0679; G06F 2212/2022; G06F 3/0619; G06F 1/206; G06F 3/0658; G06F 3/0659

USPC ............... 711/103, 106, E12.008, 102, 154; 365/222, 211, 185.25, 203, 51, 52
See application file for complete search history.

(56) References Cited

U.S. PATENT DOCUMENTS

| | | | |
|---|---|---|---|
| 7,272,063 B1* | 9/2007 | Egerer ................ | G11C 7/04 365/211 |
| 8,572,333 B2 | 10/2013 | Confalonieri | |
| 8,762,656 B2 | 6/2014 | Confalonieri | |
| 2005/0201174 A1* | 9/2005 | Klein .................. | G11C 7/00 365/222 |

(Continued)

FOREIGN PATENT DOCUMENTS

| JP | 2012-514249 A | 6/2012 |
|---|---|---|
| JP | 2012-514265 A | 6/2012 |

(Continued)

*Primary Examiner* — Yaima Rigol
*Assistant Examiner* — Edward Waddy, Jr.
(74) *Attorney, Agent, or Firm* — Winston Hsu

(57) ABSTRACT

A method for performing refresh management in a memory device, the memory device and controller thereof are provided. The method may include: monitoring a temperature of the memory device, wherein the temperature is detected through a temperature sensor; updating a recorded highest temperature and a recorded lowest temperature according to said temperature; checking whether a difference between the recorded highest temperature and the recorded lowest temperature is greater than a predetermined temperature threshold; and when the difference is greater than the predetermined temperature threshold, triggering refresh of the memory device.

20 Claims, 4 Drawing Sheets

(56) References Cited

U.S. PATENT DOCUMENTS

| | | | |
|---|---|---|---|
| 2008/0039981 A1* | 2/2008 | Wyatt | G01K 1/026 |
| | | | 700/299 |
| 2008/0312787 A1* | 12/2008 | Regnard De Lagny | |
| | | | G07C 3/00 |
| | | | 701/33.4 |
| 2011/0219203 A1 | 9/2011 | Nurminen | |
| 2014/0149653 A1* | 5/2014 | Udipi | G06F 12/0292 |
| | | | 711/106 |
| 2016/0117216 A1* | 4/2016 | Muchherla | G11C 16/10 |
| | | | 714/6.11 |
| 2016/0342346 A1* | 11/2016 | Byun | G06F 3/0685 |
| 2017/0117053 A1* | 4/2017 | Sharon | G11C 16/3418 |
| 2017/0255389 A1* | 9/2017 | Tan | G06F 3/0679 |
| 2017/0255403 A1 | 9/2017 | Sharon | |

FOREIGN PATENT DOCUMENTS

| | | |
|---|---|---|
| WO | 2010/076826 A1 | 7/2010 |
| WO | 2010/076828 A1 | 7/2010 |

* cited by examiner

METHOD FOR PERFORMING REFRESH MANAGEMENT IN A MEMORY DEVICE, ASSOCIATED MEMORY DEVICE AND CONTROLLER THEREOF

BACKGROUND OF THE INVENTION

1. Field of the Invention

The present invention relates to access of flash memories, and more particularly, to a method for performing refresh management in a memory device, an associated memory device and a controller thereof.

2. Description of the Prior Art

Developments in memory technology have enabled the wide application of portable memory devices (or non-portable memory devices), such as memory cards conforming to SD/MMC, CF, MS and XD specifications, solid state drive (SSD), and embedded storage devices conforming to the UFS or EMMC specification. Improving access control of memories in these portable memory devices still remains an issue to be solved in the art.

NAND flash memories may comprise single level cell (SLC) and a plurality of level cell (MLC) flash memories. In an SLC flash memory, each transistor used as a memory cell may have either of two electrical charge values: the logic values 0 and 1. In comparison, the storage ability of each transistor used as a memory cell in an MLC flash memory may be fully utilized. The transistors are driven by a voltage higher than that in the SLC flash memory, and different voltage levels are utilized to record information of at least two bits (such as 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in portable memory devices than an SLC flash memory. The MLC flash memory does have instability issues, however. To ensure that access control of the flash memory in the portable memory device meets required specifications, a controller of the flash memory is configured to apply management mechanisms for properly managing data access.

Memory devices inevitably have certain deficiencies, even for those with the above management mechanism. For example, under a situation where the temperature varies rapidly, the data error rate can increase significantly. Hence, there is a need for a novel method and memory access mechanism of memory devices which can provide an optimal performance without introducing side effects or in a way that is less likely to introduce side effects.

SUMMARY OF THE INVENTION

One of the objectives of the present invention is to provide a method, an associated memory device and controller thereof, and an associated electronic device for performing refresh management, in order to solve the above issue.

Another objective of the present invention is to provide a method, an associated memory device and controller thereof, and an associated electronic device for performing refresh management, in order to reach an optimal performance of the memory device without introducing side effects or in a way that is less likely to introduce side effects.

At least one embodiment of the present invention provides a method for performing refresh management in a memory device. The memory device comprises a non-volatile (NV) memory that comprises a plurality of NV memory elements. The method comprises: monitoring a temperature of the memory device, wherein the temperature is detected via a temperature sensor; updating a recorded highest temperature and a recorded lowest temperature according to the monitored temperature; checking whether a difference value between the recorded highest temperature and the recorded lowest temperature is greater than a predetermined temperature threshold; and when the difference value is greater than the predetermined temperature threshold, triggering a refresh of the memory device.

At least one embodiment of the present invention provides a memory device, which comprises an NV memory and a controller. The NV memory is arranged to store information, wherein the NV memory comprises a plurality of NV memory elements. The controller is coupled to the NV memory, and the controller is arranged to control operations of the memory device, wherein the controller comprises a processing circuit. The processing circuit is arranged to control the controller according to a plurality of host commands from a host device, in order to allow the host device to access the NV memory via the controller, wherein: the controller monitors a temperature of the memory device, wherein the temperature is detected by a temperature sensor; the controller updates a recorded highest temperature and a recorded lowest temperature according to the monitored temperature; the controller checks whether a difference value between the recorded highest temperature and the recorded lowest temperature is greater than a predetermined temperature threshold; and when the difference value is greater than the predetermined temperature threshold, the controller triggers a refresh of the memory device.

At least one embodiment of the present invention provides a controller of a memory device, the memory device comprising the controller and an NV memory. The NV memory comprises a plurality of NV memory elements. The controller comprises a processing circuit that is arranged to control the controller according to a plurality of host commands from a host device, in order to allow the host device to access the NV memory via the controller, wherein: the controller monitors a temperature of the memory device, wherein the temperature is detected via a temperature sensor; the controller updates a recorded highest temperature and a recorded lowest temperature according to the monitored temperature; the controller checks whether a difference value between the recorded highest temperature and the recorded lowest temperature is greater than a predetermined temperature threshold; and when the difference value is greater than the predetermined temperature threshold, the controller triggers a refresh of the memory device.

An advantage provided by the present invention is that operations of the memory device can be properly controlled via performing refresh management, in order to prevent data errors due to rapid variation of temperature. In addition, implementations according to the embodiments of the present invention will not greatly increase additional costs, and therefore problems which exist in related art techniques can be solved without greatly raising the overall cost. Further, the present invention may achieve optimal performance without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
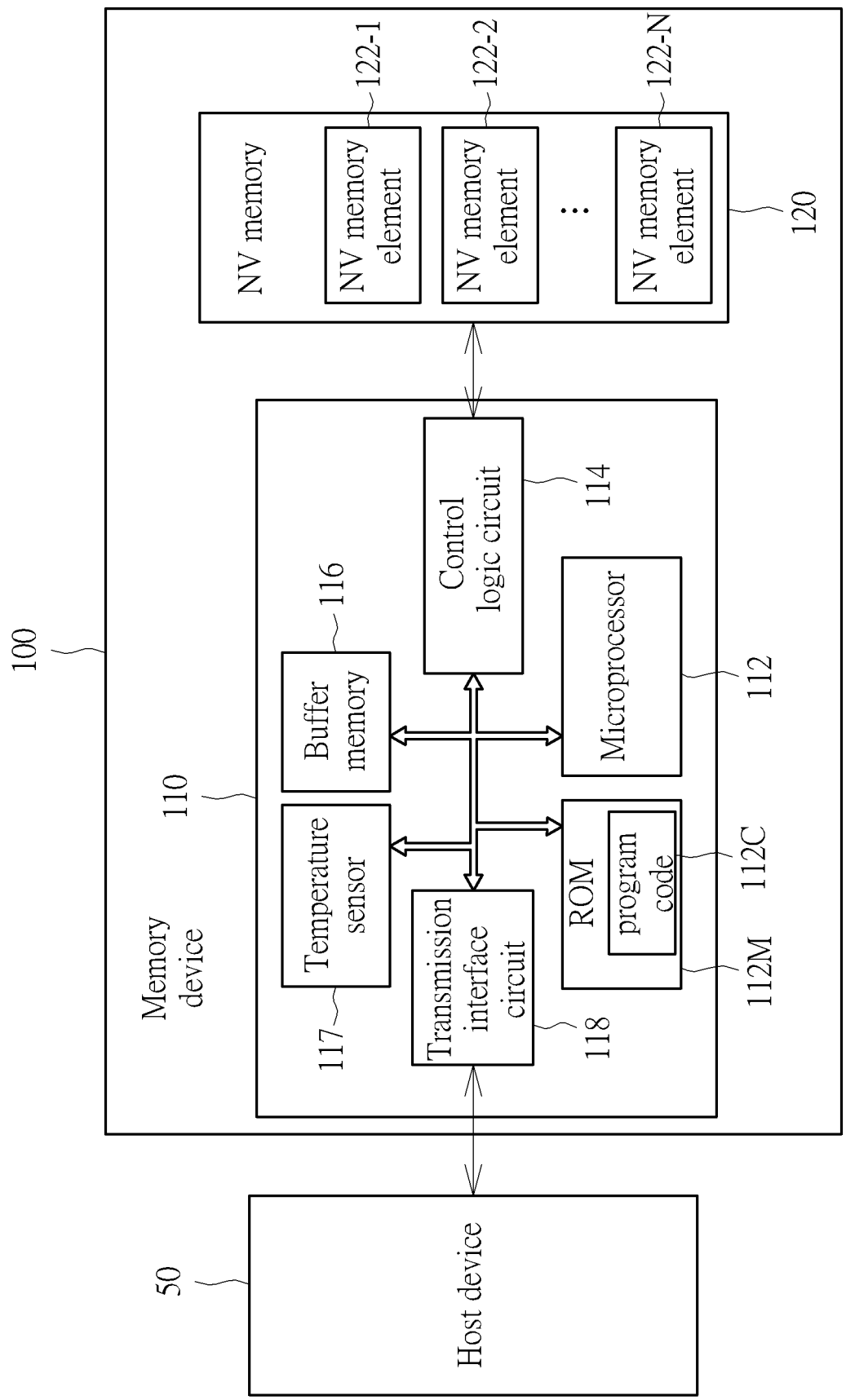
FIG. 1 is a diagram illustrating a memory device and a host device according to an embodiment of the present invention.

Refer to FIG. 1, which is a diagram illustrating a memory device 100 and a host device 50 according to an embodiment of the present invention. The host device 50 may comprise: at least one processor (not shown) arranged to control operations of the host device 50; and a power supply circuit (not shown) coupled to the processer, and arranged to provide power to the processer and the memory device 100, wherein the memory device 100 may provide storage space for the host device 50. Examples of the host device 50 may comprise (but are not limited to): a multifunctional mobile phone, tablet, wearable device, and personal computer (e.g. a desktop computer or a laptop computer). Examples of the memory device 100 may comprise (but are not limited to): a portable memory device (e.g. a memory card conforming to the SD/MMC, CF, MS, XD or UFS specification), a solid state drive (SSD) and all kinds of embedded storage devices (e.g. those conforming to the UFS or EMMC specification). According to this embodiment, the memory device 100 may comprise a controller such as a memory controller 110, and may further comprise a non-volatile (NV) memory 120, wherein the controller is arranged to access the NV memory 120, and the NV memory 120 is arranged to store information. The NV memory 120 may comprise a plurality of NV memory elements 122-1, 122-2, . . . , and 122-N, wherein the symbol "N" may represent an integer larger than 1. For example, the NV memory 120 may be a flash memory, and the NV memory elements 122-1, 122-2, . . . , and 122-N may be a plurality of flash memory chips (i.e. flash chips) or a plurality of flash memory dies (i.e. flash dies), but the present invention is not limited thereto.

As shown in FIG. 1, the memory controller 110 may comprise a processing circuit such as a microprocessor 112, a storage such as a read only memory (ROM) 112M, a control logic circuit 114, a buffer memory 116, a temperature sensor 117 and a transmission interface circuit 118, wherein these components may be coupled to one another via a bus. The buffer memory 116 is implemented with a random access memory (RAM), e.g. a Static RAM (SRAM), and can be utilized for buffering data, and the temperature sensor 117 may be arranged to detect temperatures. Further, the ROM 112M in this embodiment is arranged to store a program code 112C, and the microprocessor 112 is arranged to execute the program code 112C in order to control the access to the NV memory 120. Note that the program code 112C may also be stored into the buffer memory 116 or any other type of memory. In addition, the control logic circuit 114 may comprise an error correction circuit (not shown), in order to protect data and/or perform error corrections. The transmission interface circuit 118 may conform to a specific communications specification, such as the Serial Advanced Technology Attachment (SATA), Parallel Advanced Technology Attachment (PATA), Universal Serial Bus (USB), or Peripheral Component Interconnect Express (PCIE) specifications, and may perform communications according to the specific communications specification.

In this embodiment, the host device 50 may indirectly access the NV memory 120 of the memory device 100 by transmitting a plurality of host commands and corresponding logic addresses to the memory controller 110. The memory controller 110 receives the host commands and the logic addresses, translates the host commands into memory operating commands (which can be called operating commands, for brevity), and utilizes the operating commands to control the NV memory 120 to read or write/program memory units or data pages of specific physical addresses in the NV memory 120, wherein a physical address corresponds to a logic address. For example, the memory controller 110 may generate or update at least one logic-to-physical address mapping table to manage relationships between logic addresses and physical addresses. Further, the control logic circuit 114 may comprise a randomizer/de-randomizer (not shown), which is arranged to perform randomizing/de-randomizing operations. When the memory controller 110 writes data into the NV memory 120, the memory controller 110 may perform a randomizing operation upon the data to make the NV memory 120 store randomized data. When the memory controller 110 reads data from the NV memory 120, the memory controller 110 may perform a de-randomizing operation upon the read randomized data in order to obtain the previously written data.

II. Distribution Shift Corresponding to Temperature Variations

Figure 2:
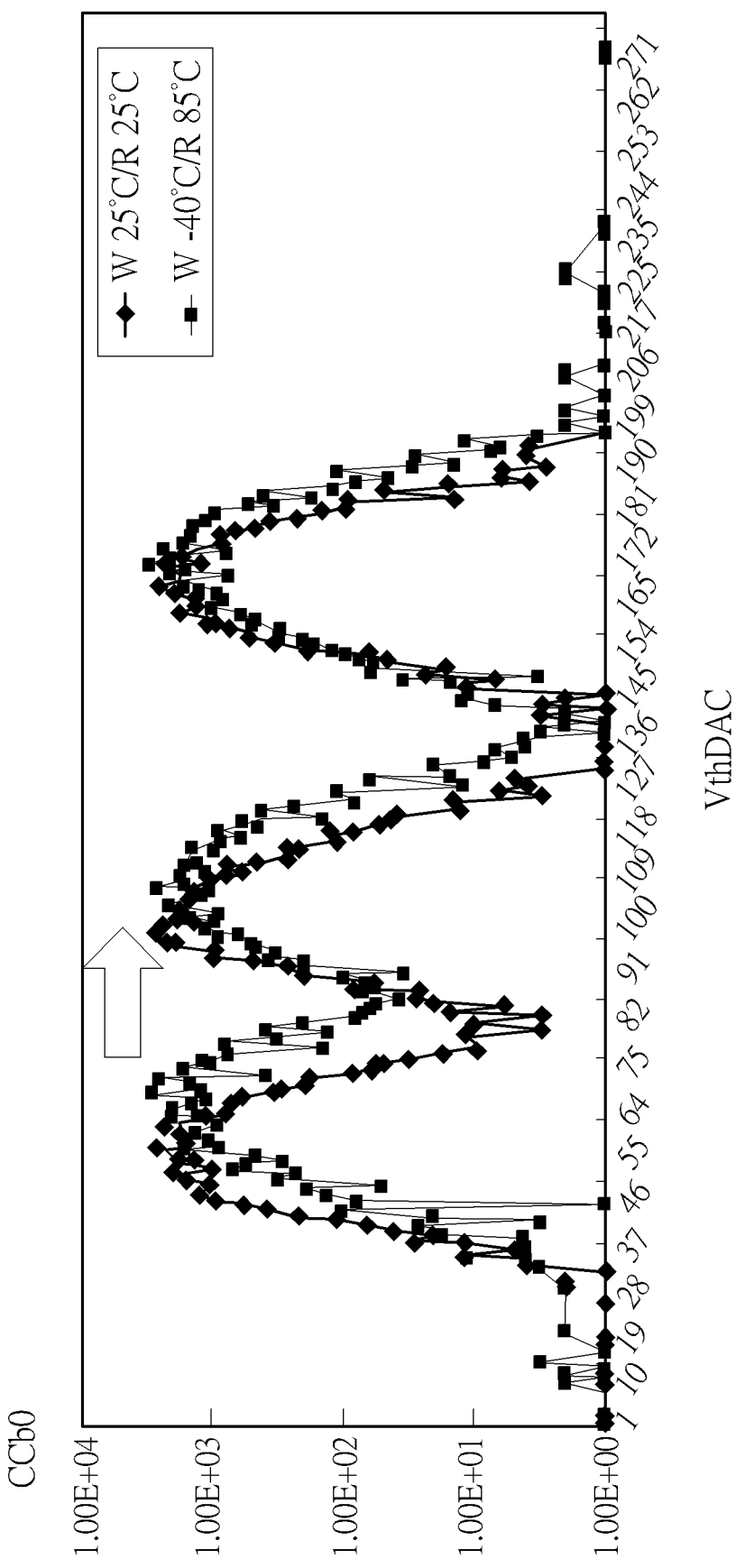
FIG. 2 illustrates a distribution shifting effect of the memory device shown in FIG. 1 according to an embodiment of the present invention.

FIG. 2 illustrates a distribution shifting effect of the memory device 100 shown in FIG. 1 according to an embodiment of the present invention. The horizontal axis in FIG. 2 may represent the digital control value Vth_DAC of the threshold voltage Vth, and the vertical axis may represent the cell count CCb0 of the memory cells carrying "0" bits in the NV memory 120 (e.g. the NV memory elements 122-1, 122-2, . . . and 122-N) that are read via the threshold voltage Vth, wherein the digital control value Vth_DAC may also be called the "threshold voltage digital control value", and the cell count CCb0 may also be called the "zero-bit cell count". Since the memory controller 110 may be equipped with a randomizing/de-randomizing mechanism (which can be actualized by utilizing the randomizer/de-randomizer to perform randomizing/de-randomizing operations), the data stored in the NV memory 120 may have been randomized.

TABLE 1

| Vth_DAC | Vth (mV) |
|---------|----------|
| 0       | 0        |
| 1       | 20       |
| 2       | 40       |
| . . .   | . . .    |
| 255     | 5100     |
| . . .   | . . .    |

Table 1 demonstrates an example of the relationship between the threshold voltage Vth and the digital control value Vth_DAC, wherein the symbols in Table 1 " . . . " represent the omissions of some table contents therein, but the present invention is not limited thereto. The digital control value Vth_DAC in this example may be an integer greater than or equal to zero, and each variation step may be 20 millivolts (mV). For example, when Vth_DAC=0, Vth=0 mV; when Vth_DAC=1, Vth=20 mV; etc. In another example, when the digital control value Vth_DAC increases to 255, Vth=5100 mV (which equals to 5.1 volts (V)).

The threshold voltage Vth is affected by temperature in a significant manner. Compared with the distribution of accessing the NV memory 120 under room temperature (e.g. both writing and reading are performed at 25° C., which is labeled "W 25° C./R 25° C."), the distribution of accessing the NV memory 120 under an abnormal temperature (e.g. writing is performed at −40° C. and reading is performed at 85° C., which is labeled "W −40° C./R 85° C.") is right shifted, which shows that accessing the NV memory 120 with the same threshold voltage Vth but with an abnormal temperature can easily result in data errors.

Figure 3:
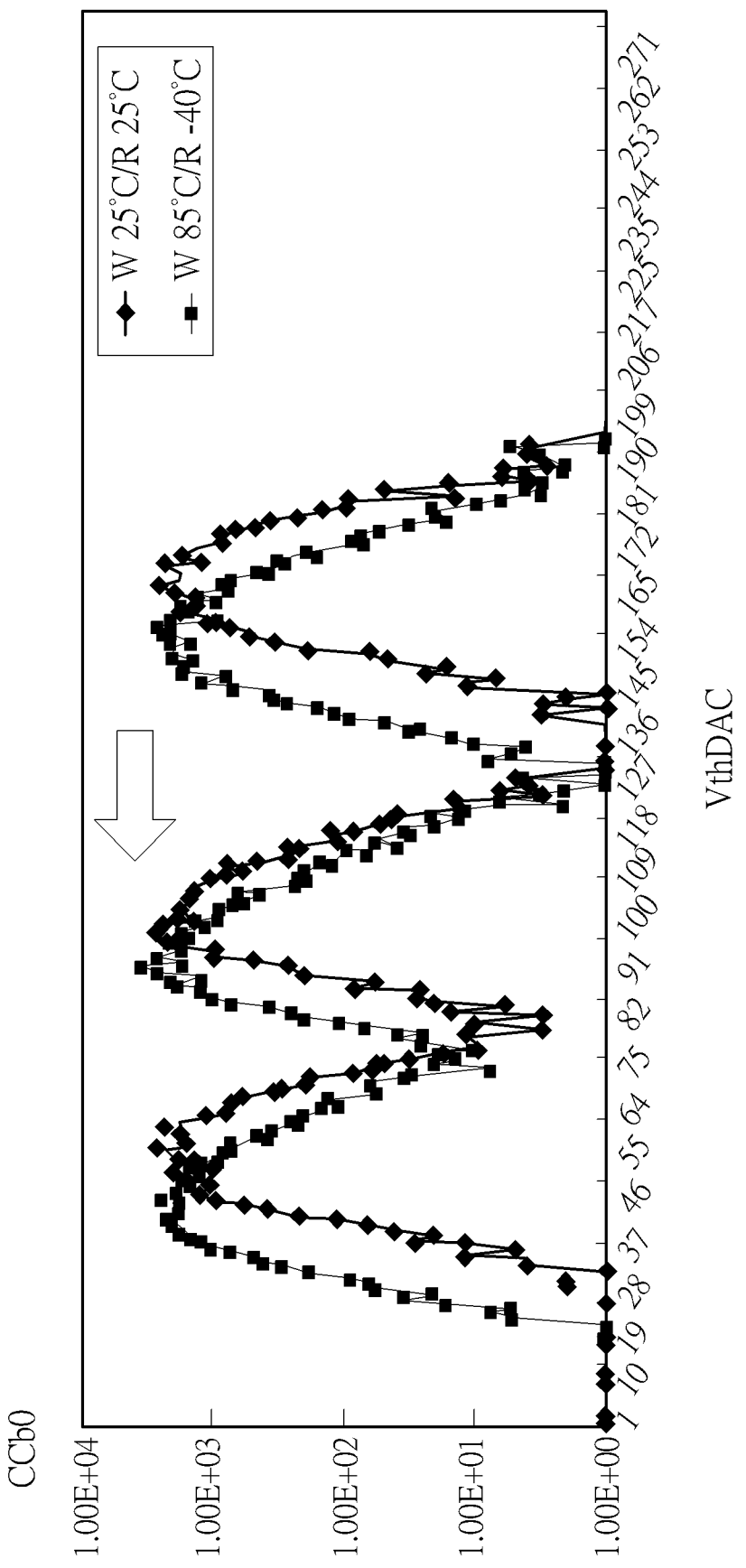
FIG. 3 illustrates a distribution shifting effect of the memory device shown in FIG. 1 according to another embodiment of the present invention.

FIG. 3 illustrates a distribution shifting effect of the memory device 100 shown in FIG. 1 according to another embodiment of the present invention. Compared with the distribution of accessing the NV memory 120 under room temperature (e.g. both writing and reading are performed at 25° C., which is labeled "W 25° C./R 25° C."), the distribution of accessing the NV memory 120 under an abnormal temperature (e.g. writing at 85° C. and reading at −40° C., labeled "W 85° C./R −40° C.") is left shifted, which further shows that accessing the NV memory 120 with the same threshold voltage Vth but with an abnormal temperature can easily result in data errors.

III. Data Refresh Management

Regarding the distribution shift, the memory controller 110 may perform a refresh of the memory device 100, and more particularly, may perform a refresh of the whole storage space (e.g. the storage space of the NV memory elements 122-1, 122-2, . . . and 122-N) of the memory device 100 in order to read data from the NV memory 120 (e.g. the data in the NV memory elements 122-1, 122-2, . . . and 122-N), and rewrite the data to the NV memory 120, wherein the logic addresses of a same set of data usually remain unchanged, while the physical addresses of the set of data are allowed to be changed. Examples of the refresh operation may comprise (but are not limited to): re-charging, re-programming, data-swapping, data-moving, etc.

Figure 4:
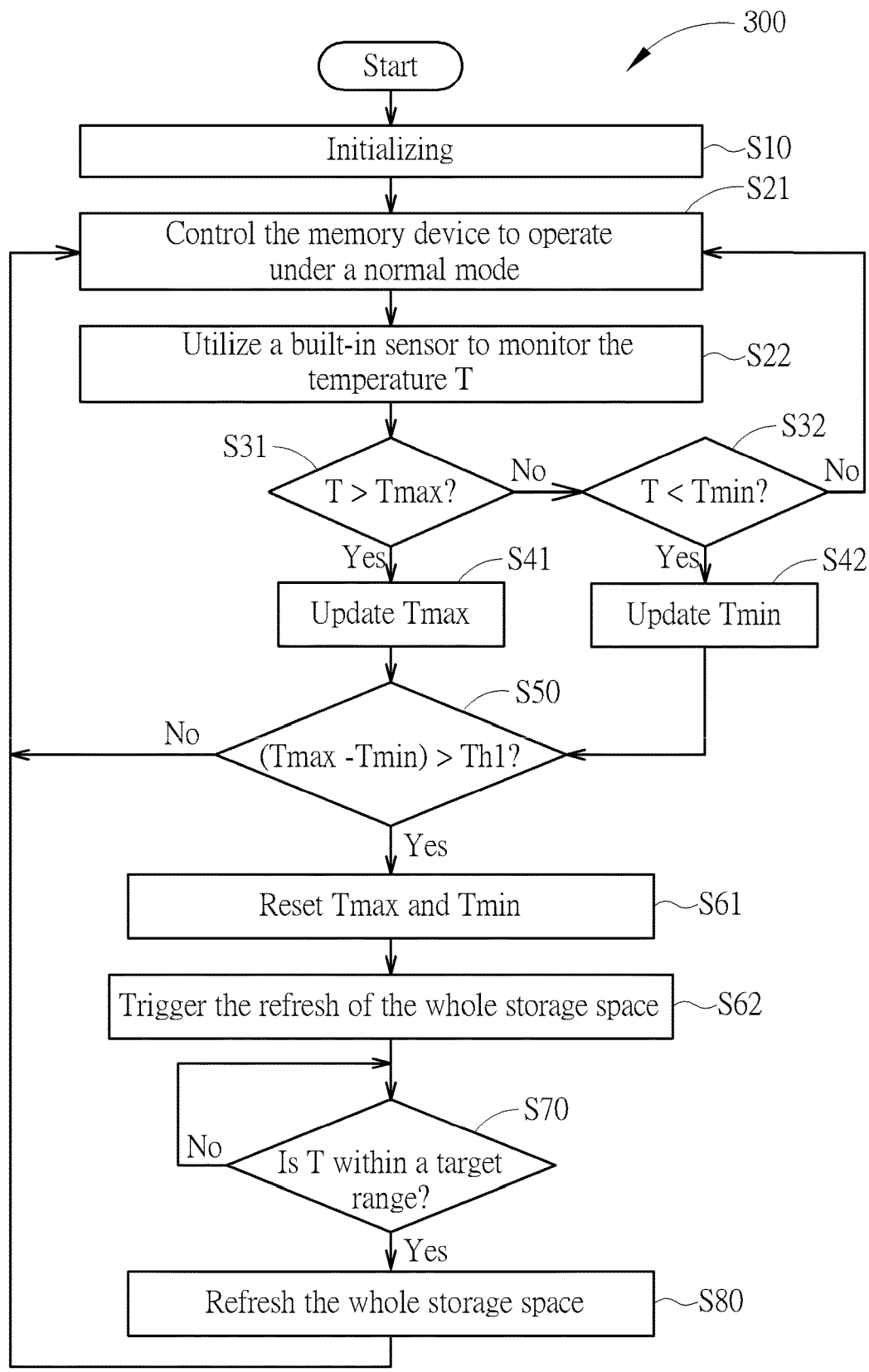
FIG. 4 is a working flow of a method for performing refresh management in a memory device according to an embodiment of the present invention.

FIG. 4 is a working flow 300 of a method for performing refresh management in a memory device according to an embodiment of the present invention, wherein the method may be applied to the memory device 100, and may be applied to the controller such as the memory controller 110.

In Step S10, the memory controller 110 may perform initialization upon the memory device 100. For example, the memory controller 110 may set both a recorded highest temperature Tmax and a recorded lowest temperature Tmin of the temperature T as a predetermined value T0 (i.e. Tmax=T0, and Tmin=T0, wherein the predetermined value T0 is used as their respective initial values), wherein the memory controller 110 may utilize the hardware resource therein (e.g. the buffer memory 116 or any type of memory) to store the predetermined value T0, the recorded highest temperature Tmax and the recorded lowest temperature Tmin. The symbols "Tmax" and "Tmin" indicate that the recorded highest temperature Tmax and the recorded lowest temperature Tmin may be regarded as a recorded maximum value and a recorded minimum value of the temperature T being monitored (e.g. the recorded maximum temperature and the recorded minimum temperature), respectively.

In Step S21, the memory controller 110 may control the memory device 100 to operate under a normal mode. For example, the microprocessor 112 may control the memory controller 110 according to the host commands from the host device 50, in order to allow the host device 50 to access the NV memory 120 via the memory controller 110.

In Step S22, the memory controller 110 may utilize a built-in sensor such as the temperature sensor 117 to monitor the temperature T of the memory device 100. For example, the memory controller 110 may use the latest temperature detected by the built-in sensor to update the temperature T, wherein the memory controller 110 may utilize the hardware resource therein (e.g. the buffer memory 116 or any other type of memory) to store the temperature T.

In Step S31, the memory controller 110 may check whether the temperature T is greater than the recorded highest temperature Tmax (labeled "T>Tmax?"). When the temperature T is greater than the recorded highest temperature Tmax, Step S41 is entered; otherwise, Step S32 is entered.

In Step S32, the memory controller 110 may check whether the temperature T is smaller than the recorded lowest temperature Tmin (labeled "T<Tmin?"). When the temperature T is smaller than the recorded lowest temperature Tmin, Step S42 is entered; otherwise, Step S21 is entered.

In Step S41, the memory controller 110 may update the recorded highest temperature Tmax, and more particularly, may update the recorded highest temperature Tmax to the latest value of the temperature T, such as the latest temperature detected by the built-in sensor.

In Step S42, the memory controller 110 may update the recorded lowest temperature Tmin, and more particularly, may update the recorded lowest temperature Tmin to the latest value of the temperature T, such as the latest temperature detected by the built-in sensor.

In Step S50, the memory controller 110 may check whether the difference value (Tmax−Tmin) between the recorded highest temperature Tmax and the recorded lowest temperature Tmin is greater than a predetermined temperature threshold Th1 (labeled "(Tmax−Tmin)>Th1?"). When the difference value (Tmax−Tmin) is greater than the predetermined temperature threshold Th1, Step S61 is entered; otherwise, Step S21 is entered.

In Step S61, the memory controller 110 may reset the recorded highest temperature Tmax and the recorded lowest temperature Tmin. For example, the memory controller 110 may reset both the recorded highest temperature Tmax and the recorded lowest temperature Tmin as the predetermined value T0 (i.e. Tmax=T0, and Tmin=T0).

In Step S62, the memory controller 110 may trigger the refresh of the whole storage space (e.g. the storage space of NV memory elements 122-1, 122-2, . . . and 122-N) of the memory device 100, wherein this trigger operation may represent entering a refresh process (e.g., by initializing the refresh process). For example, the refresh process may comprise the operations of Step S70 and Step S80, but the present invention is not limited thereto.

In Step S70, the memory controller 110 may check whether the temperature T is within a target range, wherein the target range may be a predetermined temperature range, and more particularly, may be a range corresponding to room temperature. For example, the target range may be within 20° C. to 30° C. (e.g. the interval [20, 30] (° C.)). In another example, the predetermined value T0 may be within the target range, and more particularly, may be a central value of the target range or a mean value of the two boundary values (e.g. 20° C. and 30° C.) of the target range, such as 25° C. When the temperature T is within the target range, Step S80 is entered; otherwise, Step S70 is entered once more. According to this embodiment, the memory controller 110 may wait for the temperature T to be within the target range via performing Step S70 once more, wherein the refresh of the memory device 100 is not started until the temperature T is within the target range, so, in the refresh process, the refresh of the memory device 100 is performed when the temperature T is within the target range.

In Step S80, the memory controller 110 may refresh the whole storage space (e.g. the storage space of NV memory elements 122-1, 122-2, . . . and 122-N) of the memory device 100.

According to some embodiments, adjustments such as modifying, adding and/or deleting one or more steps are allowed in the flowchart 300. For example, the timing of the operation of Step S61 may be adjusted to be performed during the refresh process (e.g. the operation of Step S61 can be postponed until after the operation of Step S62 or until after the operation of Step S70 in other embodiments), but the present invention is not limited thereto. In another example, the timing of the operation of Step S61 may be adjusted to be performed following the refresh process (e.g. the operation of Step S61 can be postponed until after the operation of Step S80).

According to some embodiments, the target range and/or predetermined value T0 may be modified. For example, regarding some nations and/or geographical areas with higher temperatures, the target range may be adjusted to be a higher temperature range, such as 35° C. to 45° C. (e.g. the interval [35, 45] (° C.)), and the predetermined value T0 may be adjusted to a higher value, such as (° C.). In another example, regarding some nations and/or geographical areas with lower temperatures, the target range may be adjusted to a lower temperature range, such as 5° C. to 15° C. (e.g. the interval [5, 15] (° C.)), and the predetermined value T0 may be adjusted to a lower temperature value, such as 10 (° C.). For brevity, similar descriptions for these embodiments are not repeated in detail here.

According to some embodiments, the memory controller 110 may determine the current value of the temperature T as the predetermined value T0 via the built-in sensor, such as the temperature sensor 117. In this situation, the operation of Step S61 may be performed following the operation of Step S80. For example, the execution of the operation of Step S61 may be postponed until after the operation of Step S80. For brevity, similar descriptions for these embodiments are not repeated in detail here.

According to some embodiments, the built-in sensor may be replaced by an external sensor (not shown), such as a temperature sensor. The external sensor may be located external to the memory device 100, and more particularly, may be located in the host device 50. In another example, the external sensor may be located in the memory device 100 but external to the memory controller 110. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing refresh management in a memory device, the memory device comprising a non-volatile (NV) memory, the NV memory comprising a plurality of NV memory elements, the method comprising:
   initially setting a recorded highest temperature to a first value and setting a recorded lowest temperature to the first value;
   monitoring a temperature of the memory device, wherein the temperature is detected via a temperature sensor;
   when the monitored temperature is greater than the first value, updating the recorded highest temperature as the monitored temperature greater than the first value, and when the monitored temperature is lower than the first value, updating the recorded lowest temperature as the monitored temperature lower than the first value;
   continuously updating the recorded highest temperature as the highest monitored temperature, and continuously updating the recorded lowest temperature as the lowest monitored temperature;
   checking whether an absolute difference-between the updated recorded highest temperature and the updated recorded lowest temperature is greater than a predetermined value; and
   when the absolute difference-is greater than the predetermined value, triggering a refresh of the memory device.

2. The method of claim 1, wherein the refresh of the memory device comprises refreshing a whole storage space of the memory device.

3. The method of claim 2, wherein the whole storage space of the memory device comprises storage space of the plurality of NV memory elements.

4. The method of claim 1, wherein the operation of triggering represents entering a refresh process.

5. The method of claim 4, further comprising:
   during the refresh process, checking whether the monitored temperature is within a target range, wherein the target range is a predetermined temperature range and the refresh of the memory device is performed when the monitored temperature is within the target range.

6. The method of claim 1, further comprising:
   checking whether the monitored temperature is within a target range, wherein the target range is a predetermined temperature range; and
   when the monitored temperature is within the target range, performing the refresh of the memory device.

7. The method of claim 6, further comprising:
   resetting both the recorded highest temperature and the recorded lowest temperature as a predetermined value, wherein the predetermined value is within the target range.

8. The method of claim 7, wherein the predetermined value is a median value of the target range.

9. The method of claim 1, wherein the trigger operation represents entering a refresh process and the method further comprises:
   during the refresh process, resetting both the recorded highest temperature and the recorded lowest temperature to the first value.

10. The method of claim 1, wherein the trigger operation represents entering a refresh process and the method further comprises:
    immediately resetting both the recorded highest temperature and the recorded lowest temperature to the first value after the refresh process.

11. A memory device, comprising:
a non-volatile (NV) memory, arranged to store information, wherein the NV memory comprises a plurality of NV memory elements; and
a controller, coupled to the NV memory, the controller arranged to control operations of the memory device, wherein the controller comprises:
  a processing circuit, arranged to control the controller according to a plurality of host commands from a host device, in order to allow the host device to access the NV memory via the controller, wherein:
  the controller initially sets a recorded highest temperature to a first value and sets a recorded lowest temperature to the first value;
  the controller monitors a temperature of the memory device, wherein the temperature is detected by a temperature sensor;
  when the monitored temperature is greater than the first value, the controller updates the recorded highest temperature as the monitored temperature greater than the first value, and when the monitored temperature is lower than the first value, the controller updates the recorded lowest temperature as the monitored temperature lower than the first value;
  the controller continuously updates the recorded highest temperature as the highest monitored temperature, and continuously updates the recorded lowest temperature as the lowest monitored temperature;
  the controller checks whether an absolute difference between the updated recorded highest temperature and the updated recorded lowest temperature is greater than a predetermined value; and
  when the absolute difference is greater than the predetermined value, the controller triggers a refresh of the memory device.

12. The memory device of claim 11, wherein the refresh of the memory device comprises refreshing a whole storage space of the memory device.

13. The memory device of claim 12, wherein the whole storage space of the memory device comprises storage space of the plurality of NV memory elements.

14. The memory device of claim 11, wherein the trigger operation represents entering a refresh process.

15. The memory device of claim 14, wherein during the refresh process, the controller checks whether the monitored temperature is within a target range, wherein the target range is a predetermined temperature range and the refresh of the memory device is performed when the monitored temperature is within the target range.

16. A controller of a memory device, the memory device comprising the controller and a non-volatile (NV) memory, the NV memory comprising a plurality of NV memory elements, the controller comprising:
  a processing circuit, arranged to control the controller according to a plurality of host commands from a host device, in order to allow the host device to access the NV memory via the controller, wherein:
  the controller initially sets a recorded highest temperature to a first value and sets a recorded lowest temperature to the first value;
  the controller monitors a temperature of the memory device, wherein the temperature is detected via a temperature sensor;
  when the monitored temperature is greater than the first value, the controller updates the recorded highest temperature as the monitored temperature greater than the first value, and when the monitored temperature is lower than the first value, the controller updates the recorded lowest temperature as the monitored temperature lower than the first value;
  the controller continuously updates the recorded highest temperature as the highest monitored temperature, and continuously updates the recorded lowest temperature as the lowest monitored temperature;
  the controller checks whether an absolute difference between the updated recorded highest temperature and the updated recorded lowest temperature is greater than a predetermined value; and
  when the absolute difference is greater than the predetermined value, the controller triggers a refresh of the memory device.

17. The controller of claim 16, wherein the refresh of the memory device comprises refreshing a whole storage space of the memory device.

18. The controller of claim 17, wherein the whole storage space of the memory device comprises storage space of the plurality of NV memory elements.

19. The controller of claim 16, wherein the trigger operation represents entering a refresh process.

20. The controller of claim 19, wherein during the refresh process, the controller checks whether the monitored temperature is within a target range, wherein the target range is a predetermined temperature range and the refresh of the memory device is performed when the monitored temperature is within the target range.

* * * * *